(12) United States Patent
Nayak et al.

(10) Patent No.: US 7,863,971 B1
(45) Date of Patent: Jan. 4, 2011

(54) CONFIGURABLE POWER CONTROLLER (75) Inventors: Anup Nayak, Fremont, CA (US);
Sanjay Kumar Sancheti, Sunnyvale, CA (US); Shailja Garg, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 286 days.

(21) Appl. No.: 11/998,009

(22) Filed: Nov. 27, 2007

Related U.S. Application Data (60) Provisional application No. 60/861,154, filed on Nov. 27, 2006.

(51) Int. Cl.
*H03K 17/74* (2006.01)
*G11C 5/14* (2006.01)

(52) U.S. Cl. .................. 327/546; 327/543; 365/227; 365/229

(58) Field of Classification Search .......... None
See application file for complete search history.

(56) References Cited

U.S. PATENT DOCUMENTS

| | | | |
|---|---|---|---|
| 6,049,245 A * | 4/2000 | Son et al. .......... | 327/544 |
| 6,069,833 A * | 5/2000 | Koura .......... | 365/226 |
| 7,158,436 B2 * | 1/2007 | Lee .......... | 365/226 |
| 7,362,646 B2 * | 4/2008 | Otsuka et al. .......... | 365/226 |
| 7,372,764 B2 * | 5/2008 | Nautiyal et al. .......... | 365/229 |
| 7,436,205 B2 * | 10/2008 | Tada .......... | 326/33 |
| 2008/0018389 A1 * | 1/2008 | Kim et al. .......... | 327/544 |
| 2009/0243711 A1 * | 10/2009 | Marinca .......... | 327/541 |

OTHER PUBLICATIONS

Changbo Long, Jinjun Xiong, Lei He, "On Optimal Physical Synthesis of Sleep Transistors", International Symposium on Physical Design, ISBN: 1-58113-817-2, 2004 pp. 156-161.
Tschanz, J., Narendra, S., Yibin Ye, Bloechel, B., Borkar, S., De, V., "Dynamic-Sleep Transistor and Body Bias for Active Leakage Power Control of Microprocessors", IEEE Journal of Solid-State Circuits, vol. 38, No. 11, Nov. 2003, pp. 1838-1845.
A. Ramalingam, B. Zhang, A. Devgan, D. Z. Pan, "Sleep Transistor Sizing Using Timing Criticality and Temporal Currents", Proc. Asia South Pacific Design Automation Conference (ASPDAC), Jan. 2005.

* cited by examiner

*Primary Examiner*—Lincoln Donovan
*Assistant Examiner*—Terry L Englund (57) ABSTRACT

A configurable power controller and method for controlling power of a macro circuit block, such as a memory circuit, in multiple power modes is described to help minimize power consumption of the macro circuit block when the application environment for the macro circuit block is in a lower power mode than during its normal power mode.

25 Claims, 6 Drawing Sheets

FIG. 1

PRIOR ART

CONFIGURABLE POWER CONTROLLER

RELATED APPLICATIONS

This application claims the priority of U.S. Provisional Application Ser. No. 60/861,154, filed Nov. 27, 2006, which is hereby incorporated by reference.

TECHNICAL FIELD

Embodiments of the present invention relate to configurable power controllers and, in one particular embodiment, to a configurable power controller for a macro circuit block.

BACKGROUND

Conventional computing systems (e.g., personal computers, cellular phones, personal digital assistants, media players and digital cameras) shave controlling features. Power control is used to reduce the dynamic and static power consumption of a system to increase the battery life and to reduce energy costs of the system, which is particularly valuable in mobile devices. Dynamic power is consumed by all components of a system during state switching of internal electronic circuits (i.e. while the device is in active operation), while static power is consumed due to the leakage currents of electronic devices.

In a conventional technique, "sleep" transistors are used to cut off power supplies to logic blocks of an electronic device when the device is in a low-power state. In some conventional solutions, a memory is provided with a reduced-supply voltage in a sleep mode.

Figure 1:
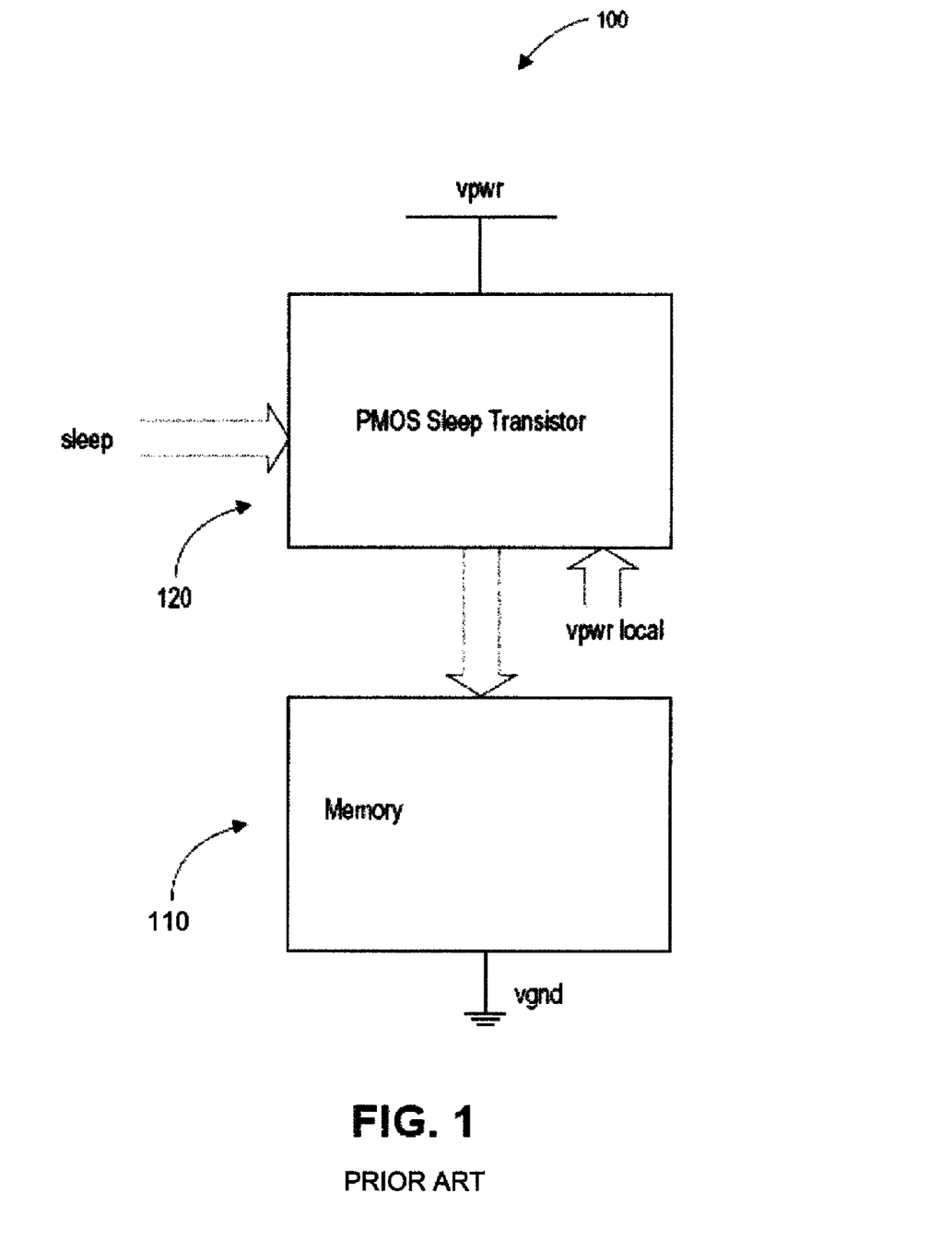
FIG. 1 illustrates a conventional power control circuit.

FIG. 1 illustrates a conventional power control circuit 100, which includes a memory block 110 coupled to a PMOS (P-channel Metal Oxide Semiconductor) transistor 120. The power control circuit 100 is coupled between a supply voltage "vpwr" and a grounded terminal "vgnd." The PMOS transistor 120 is coupled between a global power supply voltage "vpwr" and local power supply voltage "vpwr local." A gate terminal (not shown in the figure) of the PMOS transistor 120 is coupled to a control signal "sleep", which when enabled causes the memory block 110 to go into a sleep/power reduction mode. However, the conventional power control circuit 100 does not provide low power, power cut off and data retention features at the same time. This means that if the device enters a low power mode, the data is lost (i.e. not retained).

BRIEF DESCRIPTION OF THE DRAWINGS

The present invention is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention. It should be noted that the "line" or "lines" discussed herein, that connect elements, may be single lines or multiple lines.

Embodiments of the present invention set forth below include a configurable power controller and method for controlling power of a macro circuit block, such as a memory circuit, in multiple power modes (e.g., a sleep mode, a normal operation mode and a data retention mode) to help minimize power consumption of the macro circuit block when the application environment for the macro circuit block is in a lower power state, than during its normal power mode. It should be noted that embodiments of the present invention may be described at times in regards to a memory type of a macro circuit block. In alternative embodiments, other types of macro circuit blocks may be used, for example, PLLs, serial interface physical layer circuits such as USB PHYs, or other types of custom or hard macro block circuits.

Figure 2:
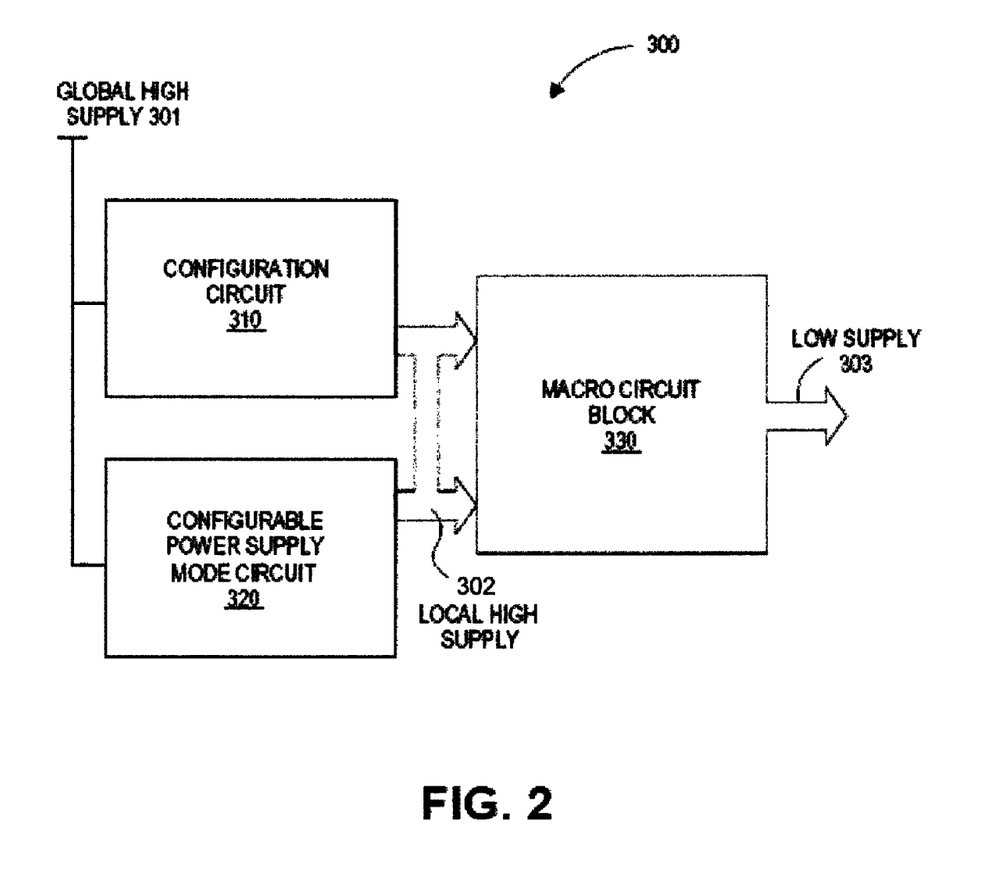
FIG. 2 illustrates a block diagram of a configurable power controller coupled with a macro circuit block, according to one embodiment of the present invention.

FIG. 2 illustrates a block diagram of a configurable power controller coupled with a macro circuit block, according to one embodiment of the present invention. Device 300 includes a configurable power controller 320 and a configuration circuit 310 coupled to a macro circuit block 330. The configurable power controller 320 and a configuration circuit 310 are coupled between a global high voltage supply 301 and a local high power supply node 302 of the macro circuit block 330. The macro circuit block 330 is also coupled to a low power supply node 303, such as a ground.

In one embodiment, the configurable power controller 320 comprises a configuration circuit and a configurable power supply mode circuit (discussed in relation to FIG. 3) coupled between the global system power supply 301 and the local high power supply 302 of a macro circuit block. In one embodiment, the configurable power controller 320 uses two control inputs (e.g., a sleep input and a configuration input) to control three configurable power modes of the macro circuit block 330 for effective power management. For example, the configurable power controller 320 can be configured to completely cut-off power supplied to the macro circuit block (e.g., memory) 330 when the application environment is in a low power state. Such a low power state may be referred to as a "sleep mode." The configurable power controller 320 may also be configured to provide a reduced supply voltage when the application environment is in another low-power state. Such other type of low power state may be referred to as a "data retention mode." The selection between the different types of reduced power supply modes may be made using a configuration input 306.

The natural parasitics of routing interconnects in the configurable power supply mode circuit can be used to reduce in-rush current when the macro circuit block 330 is switched back to its normal power mode. In one particular embodiment, a serpentine routing of gate interconnects, or traces, may be used to reduce the in-rush current and affect a switching delay in transitioning between the different power states, or modes.

Figure 3:
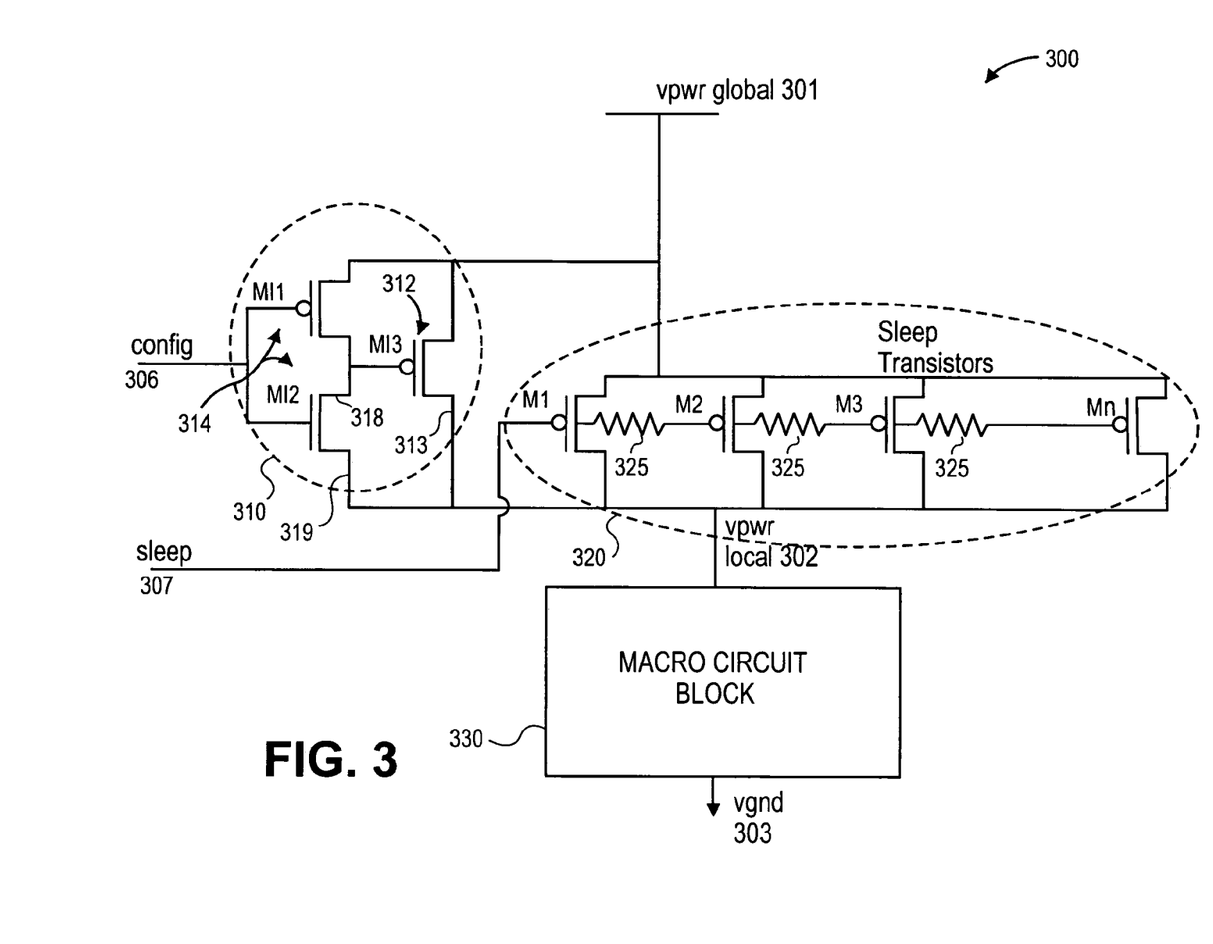
FIG. 3 illustrates a configurable power controller circuit, according to one embodiment of the present invention.

FIG. 3 illustrates a configurable power controller circuit, according to one embodiment of the present invention. The configuration circuit 310 includes a configurable diode unit 312 and an enabling circuit 314 coupled between the global high supply voltage node 301 and the local high power supply 302 of a macro circuit block 330. In one embodiment, the configurable diode unit 312 includes a Metal Oxide Semiconductor (MOS) transistor 312 and the enabling circuit 314 includes a pair of MOS transistors coupled together at their gate terminals. The pair of MOS transistors 314 outputs a signal at a gate terminal of the MOS transistor 312. The gate terminals of the pair of MOS transistors 314 are coupled to receive a configuration control signal (config) 306. The configuration signal 306 is applied to the gate terminals of the pair of MOS transistors 314 for enabling and disabling the configurable diode 312. In one embodiment, the configurable diode 312 (which may be referred to as a diode transistor) is a PMOS transistor. In one embodiment, the pair of MOS transistors 314 is composed of a PMOS transistor and a NMOS (N-channel Metal Oxide Semiconductor) transistor coupled at their gate terminals. Transistors MI1 and MI2 operate as switches that allow the configurable diode MI3 312 to be effective under the control of the configuration signal 306 labeled "config." In this embodiment, MI1 is a PMOS switch and MI2 is a NMOS switch. When "config" goes to a logic high level, MI2, the NMOS switch turns on presenting a low resistance between its drain 318 and source 319. This low resistance effectively shorts the gate of MI3 with its drain 313 (the two nodes between which MI2 is connected) and MI3 works as a diode between vpwr global 301 and vpwr local 302. In this state MI1 remains in an off state. When config=0, MI2 turns off, isolating the gate and drain 313 of MI3. Further, MI1 turns on, connecting the gate of MI3 to vpwr global 301. This turns off MI3, and MI3 is not capable of acting as the diode.

The configurable power supply mode circuit 320 includes a plurality of Metal Oxide Semiconductor (MOS) transistors M1-Mn having their gate terminals coupled through a plurality of resistors 325. The plurality of MOS transistors M1-Mn has a common switching configuration (PMOS configuration in an embodiment). Switching operations (turning on and turning off) of the plurality of transistors are controlled by a reduced power (e.g., sleep) mode control signal 307 (sleep). In one embodiment, M1 through Mn are PMOS sleep transistors, when sleep=1, all of them are off. When sleep 0, M1 through Mn are sequentially turned on. In one embodiment, the resistors 325 may be formed by the routing of the transistor M1-Mn gates in polysilicon, as discussed below. In another embodiment, the resistors 325 may be formed in other manners, for example, from diffusion regions or n-wells.

The reduced power mode control signal (sleep) 307 is coupled to a gate terminal of a first MOS transistor of the plurality of transistors M1-Mn. Both the configurable diode 312 and the plurality of transistors 320 are coupled between the global high power supply 301 (vpwr global) and the local high power supply 302 (vpwr local) of the macro circuit block 330. The macro circuit block 330 is coupled between the local high power supply 302 (vpwr local) and a low voltage supply node 303, such as ground (vgnd). In one embodiment, the plurality of MOS transistors M1-Mn are PMOS transistors. In an alternative embodiment, the PMOS transistors of device 300 can be replaced by NMOS transistors and the NMOS transistors can be replaced by PMOS transistors. A gate terminal of each transistor of the plurality of transistors M1-Mn may be made using polysilicon (also referred to as poly).

Figure 6:
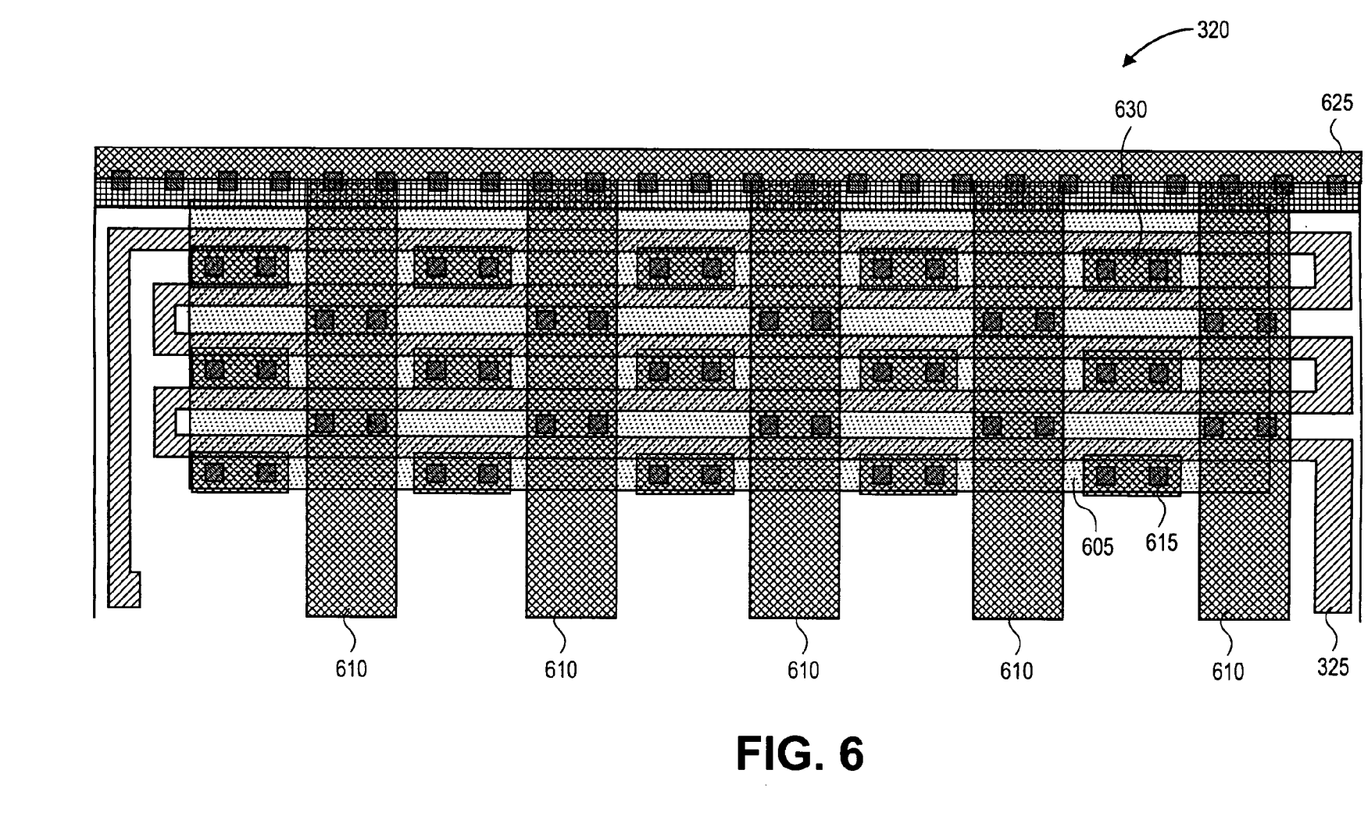
FIG. 6 illustrates a layout with serpentine routing for transistors in a configurable power supply mode circuit, according to one embodiment of the present invention.

FIG. 6 illustrates a layout with serpentine routing for transistors in a configurable power supply mode circuit 320, according to one embodiment of the present invention. FIG. 6 shows five transistors connected in parallel. The dotted region 605 is a diffusion region. The cross-hatched regions (e.g., region) 610 are metal and the square regions (e.g., 615) are contacts between the metal and the diffusion region 605. The source nodes of the transistors are connected together with metal 625. The drains nodes of the transistors are illustrated by the rectangular shaded regions (e.g., 630) that are connected together in a higher layer metal (not shown). The five transistors share a single logical gate node, each connected through the resistors 325. In this embodiment, the plurality of resistors 325 that couple the polysilicon gates of the transistors M1-Mn are polysilicon routing traces laid out in a serpentine manner.

The polysilicon is laid out using a serpentine routing because the effect of serpentine traces in such a layout is the introduction of an effective propagation delay. Thus, the serpentine routing of the plurality of resistors 325 contribute to the switching delay for the plurality of transistors M1-Mn. In one embodiment, for example, a serpentine routing is laid out to introduce approximately a 50 nanosecond delay and reduce the in-rush current by a factor of 10 to approximately 12 mA. It should be noted that such values are only exemplary and that other delays and in-rush currents may be achieved.

Figure 4:
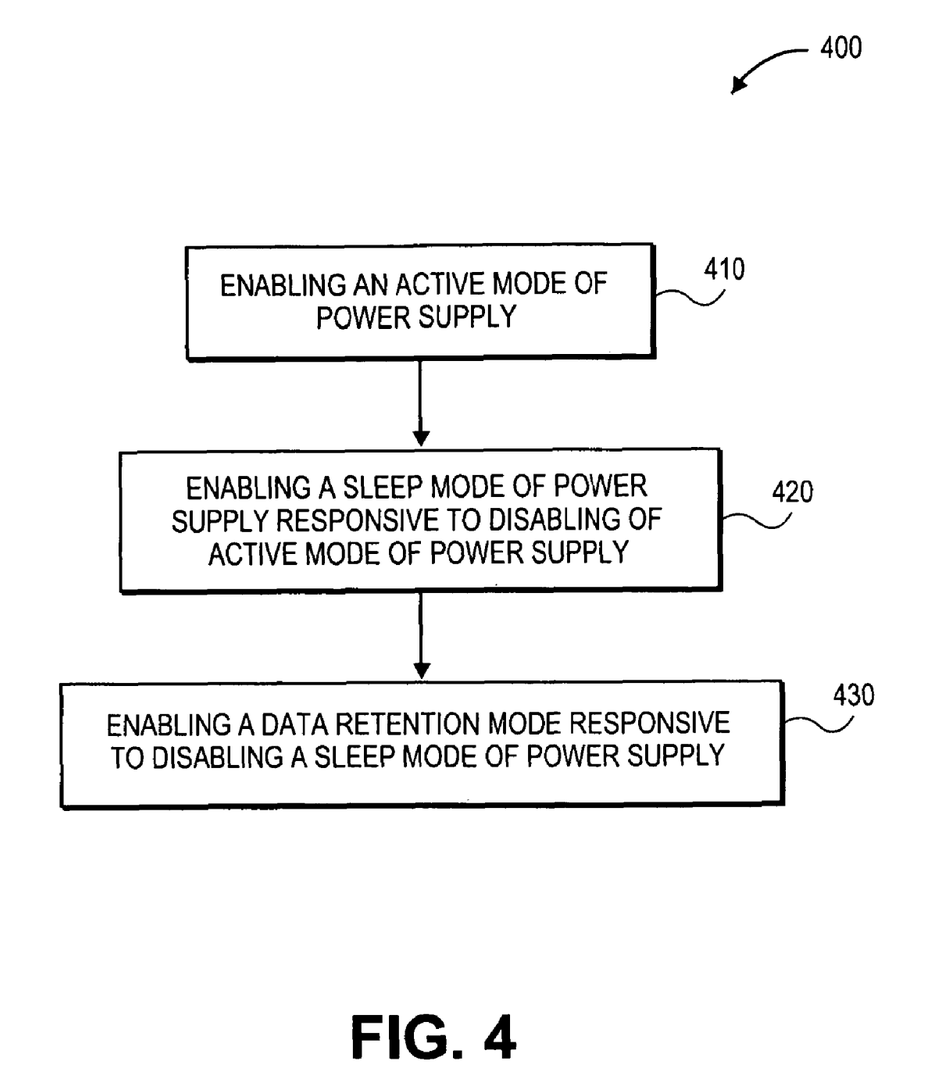
FIG. 4 illustrates a method for controlling macro circuit block power states, according to one embodiment of the present invention.

FIG. 4 is a flow chart illustrating a method 400 for controlling macro circuit block power states, according to one embodiment of the present invention. In one step, 410, an active mode of power supply is enabled for device 300. The step of enabling an active mode of power supply may include turning on the plurality of sleep mode transistors M1-Mn. The turning on of the sleep mode transistors may be performed while reducing an in-rush current by generating a switching delay. The switching delay may be generated by providing a serpentine routing for gate terminals of MOS transistors as described above.

In another step, 420, a sleep mode of power supply responsive to disabling of the active mode of power supply is enabled. The step of enabling a sleep mode of power supply responsive to disabling of the active mode of power supply includes turning off a plurality of sleep mode transistors. The step of enabling a sleep mode may also include turning off the configurable diode. The turning off the sleep mode transistors and turning off the configurable diode may minimize supply of power to the macro circuit block.

In step, 430, a data retention mode responsive to disabling a sleep mode of power supply is enabled. The step of enabling a data retention mode responsive to disabling a sleep mode of power supply includes turning off the sleep mode transistors and turning on the configurable diode. Turning off the sleep mode transistors and turning on the configurable diode may provide a reduced supply voltage to the macro circuit block.

Figure 5:
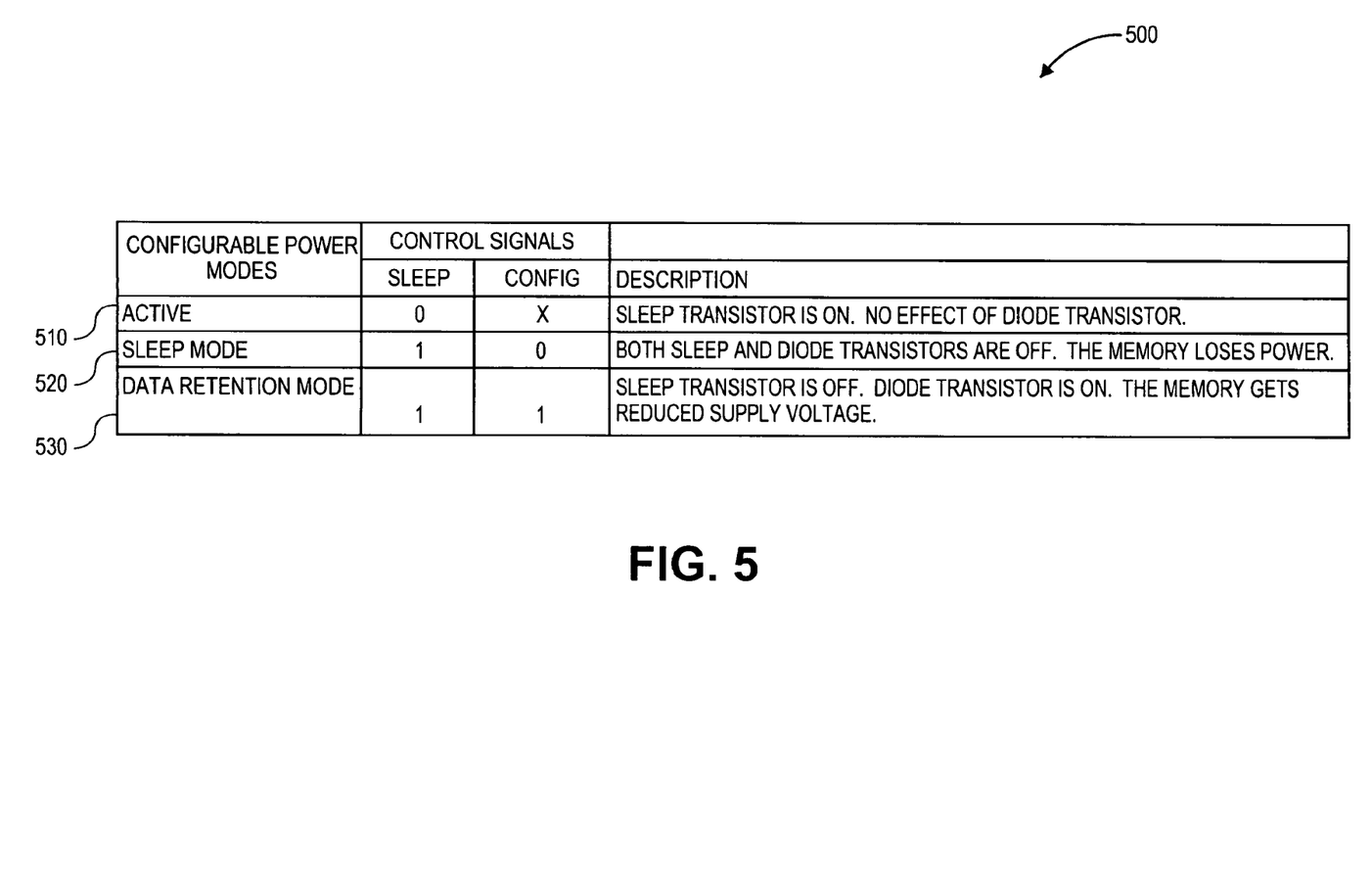
FIG. 5 illustrates a table depicting various operational modes of a configurable memory power control circuit, according to one embodiment of the present invention.

Referring to FIG. 5, a table 500 is shown which illustrates various modes of operation of the device 300 according to one embodiment of the present invention. In active mode 510, a logic zero value on "sleep" signal turns on the plurality of transistors M1-Mn (also referred to as reduced power mode transistors). As described above, in one embodiment, the serpentine poly gate routing contributes to switching delay of the transistors. A logic 0 or a logic 1 value could be applied to the configuration (config) signal.

In sleep mode 520, a logic one value on "sleep" signal turns off the plurality of transistors M1-Mn. A logic zero value on "config" signal turns off the configurable diode and the memory loses power, causing it to enter into sleep mode.

In data retention mode 530, a logic one value on "sleep" and "config" signals turns off the sleep transistors and turns on the configurable diode. The memory gets a reduced supply voltage level, which is enough for data retention.

Alternative embodiments may include more or less than three power modes or different power modes than those illustrated in FIG. 5. Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An apparatus, comprising:
   a macro circuit block coupled between a local high power supply node and a low power supply node;
   a configuration circuit coupled between the local high power supply node of the macro circuit block and a global high power supply node, the configuration circuit comprising an enabling circuit and a configurable diode, wherein the configurable diode comprises a first metal-oxide-semiconductor (MOS) transistor and the enabling circuit comprises a second MOS transistor that includes a source terminal coupled to the global high power supply node and a third MOS transistor that includes a source terminal coupled to the local high power supply node; and
   a configurable power supply mode circuit coupled to the configuration circuit, the configurable power supply mode circuit further coupled between the local high power supply node of the macro circuit block and the global high power supply node.

2. The apparatus of claim 1, wherein the macro circuit block is a memory.

3. The apparatus of claim 1, wherein the configurable diode is coupled between the local high power supply node of the macro circuit block and the global high power supply node.

4. The apparatus of claim 3,
   wherein the second and third MOS transistors include respective gate terminals coupled together to receive a configuration control signal; and
   wherein the first MOS transistor is coupled to an output terminal of the enabling circuit.

5. The apparatus of claim 4, wherein the configurable power supply mode circuit comprises a plurality of MOS transistors that include respective gate terminals coupled together to receive a power mode control signal, wherein each of the plurality of MOS transistors has an input terminal coupled to the global high power supply node and an output terminal coupled to the local high power supply node of the macro circuit block.

6. The apparatus of claim 5, wherein the configurable power supply mode circuit further comprises one or more resistors, each coupled between gate terminals of the plurality of MOS transistors.

7. The apparatus of claim 6, wherein the one or more resistors comprise serpentine routing traces.

8. The apparatus of claim 7, wherein the plurality of MOS transistors comprises P-channel Metal Oxide Semiconductor (PMOS) transistors.

9. The apparatus of claim 8, wherein a turn on and a turn off of the plurality of PMOS transistors is controlled by the power mode control signal.

10. The apparatus of claim 6, wherein the plurality of MOS transistors comprises N-channel Metal Oxide Semiconductor (NMOS) transistors.

11. The apparatus of claim 1, wherein the configurable power supply mode circuit comprises a plurality of MOS transistors that include-respective gate terminals coupled together to receive a power mode control signal, wherein each of the plurality of MOS transistors has an input terminal coupled to the global high power supply node and an output terminal coupled to the local high power supply node of the macro circuit block.

12. The apparatus of claim 11, wherein the configurable power supply mode circuit further comprises one or more resistors, each coupled between gate terminals of the plurality of MOS transistors.

13. The apparatus of claim 12, wherein the one or more resistors comprise serpentine routing traces.

14. The apparatus of claim 13, wherein the plurality of MOS transistors comprises P-channel Metal Oxide Semiconductor (PMOS) transistors.

15. The apparatus of claim 14, wherein a turn on and a turn off of the plurality of PMOS transistors is controlled by the power mode control signal.

16. The apparatus of claim 12, wherein the plurality of MOS transistors comprises N-channel Metal Oxide Semiconductor (NMOS) transistors.

17. An apparatus, comprising:
    a macro circuit block; and
    means for minimizing power consumption of the macro circuit block using a configurable power controller coupled between a global high power supply node and a local high power supply node of the macro circuit block, wherein the means for minimizing power consumption comprises a configurable diode transistor, means for shorting a gate terminal of the configurable diode transistor with a drain terminal of the configurable diode transistor if a power mode control signal is active, and means for shorting the gate terminal of the configurable diode transistor with a source terminal of the configurable diode transistor if the power mode control signal is inactive.

18. The apparatus of claim 17, wherein the means for minimizing power consumption further comprises means for reducing an in-rush current of the macro circuit block when the macro circuit block is switched from a reduced power mode to a normal power mode.

19. A method, comprising:
   enabling an active mode of power supply to a macro circuit block;
   enabling a sleep mode of power supply to the macro circuit block responsive to disabling of the active mode of power supply by shorting a gate terminal of a configurable diode transistor with a source terminal of the configurable diode transistor; and
   enabling a data retention mode of power supply to the macro circuit block by shorting the gate terminal of the configurable diode transistor with a drain terminal of the configurable diode transistor, wherein the configurable diode transistor is coupled between a global high power supply and a local high power supply node of the macro circuit block.

20. The method of claim 19, wherein the enabling the active mode of power supply to the macro circuit block comprises turning on a plurality of reduced power mode transistors coupled between the global high power supply and the local high power supply node of the macro circuit block.

21. The method of claim 20, further comprising reducing an in-rush current through the plurality of reduced power mode transistors while turning on the plurality of reduced power mode transistors.

22. The method of claim 21, wherein reducing the in-rush current comprises generating a switching delay in the plurality of reduced power mode transistors.

23. The method of claim 22, wherein the generating the switching delay comprises providing a serpentine routing between gate terminals of the plurality of reduced power mode transistors.

24. The method of claim 20, wherein enabling the sleep mode of power supply to the macro circuit block comprises:
   turning off the plurality of reduced power mode transistors; and
   turning off the configurable diode transistor.

25. The method of claim 20, wherein enabling the data retention mode further comprises:
   turning off the plurality of reduced power mode transistors; and
   turning on the configurable diode transistor.

\* \* \* \* \*